US008898550B2

(12) United States Patent
Cideciyan

(10) Patent No.: US 8,898,550 B2
(45) Date of Patent: Nov. 25, 2014

(54) ENCODING OF DATA FOR TRANSMISSION

(71) Applicant: International Business Machines Corporation, Armonk, NY (US)

(72) Inventor: Roy D. Cideciyan, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 88 days.

(21) Appl. No.: 13/765,382

(22) Filed: Feb. 12, 2013

(65) Prior Publication Data

US 2013/0346823 A1 Dec. 26, 2013

(30) Foreign Application Priority Data

Jun. 26, 2012 (EP) .................................... 12173638

(51) Int. Cl.
*H03M 13/00* (2006.01)
*H03M 13/13* (2006.01)
*H04L 1/00* (2006.01)
*H04L 25/49* (2006.01)

(52) U.S. Cl.
CPC ............. *H03M 13/13* (2013.01); *H04L 1/0041* (2013.01); *H04L 25/4908* (2013.01)
USPC ........................... 714/776; 714/752; 714/758

(58) Field of Classification Search
CPC ... H03M 13/13; H04L 25/4908; H04L 1/9957
See application file for complete search history.

(56) References Cited

U.S. PATENT DOCUMENTS

| | | | |
|---|---|---|---|
| 6,952,405 B2 * | 10/2005 | Tsang et al. | 370/252 |
| 7,127,653 B1 | 10/2006 | Gorshe | |
| 8,270,433 B2 * | 9/2012 | Jiang | 370/466 |
| 2010/0091794 A1 * | 4/2010 | Jiang | 370/468 |
| 2011/0013690 A1 * | 1/2011 | Kobayashi et al. | 375/240 |
| 2013/0235886 A1 * | 9/2013 | Wang | 370/474 |

OTHER PUBLICATIONS

IEEE 802.3an Part 3: Carrier Sense Multiple Access with Collision Detection (CSMA/CD) Access Method and Physical Layer Specifications; Amendment 1 :Physical Layer and Management Parameters for 10 Gb/s Operation, Type 10GBASE-T, IEEE Computer Society, Sep. 1, 2006. pp. 1-181.*
M. Teshima et al., "Bit-Error-Tolerant (512*N)B/(513*N+1)B Code for 40GB/s and 100Gb/s Ethernet TransporL" IEEE: 2008, pp. 1-6.*
A. Vazquez et al., "A New Family of High-Performance Parallel Decimal Mulitpliers," IEEESymposium on Computer Arithmetic (ARITH'07), 2007, pp. 1-10.

(Continued)

*Primary Examiner* — John Trimmings
(74) *Attorney, Agent, or Firm* — Cantor Colburn LLP

(57) ABSTRACT

A data encoding method for encoding a sequence of N input blocks of bits into an output block for transmission includes adding an L-bit control indicator, indicating whether the sequence contains any control blocks, and if so, producing an output block in which the order of data and control blocks is preserved by deleting a set of bits from the block-type field of at least one control block, adding to the sequence an N-bit position indicator indicating positions of data and control blocks in the sequence, and providing in bit positions of remaining bits of the block-type field of the at least one control block an indication of the type of that control block; wherein the position indicator bits are added at bit-positions such that, in a header-first transmission order of the output block, all data and control blocks succeed the position indicator bits indicating positions of those blocks.

22 Claims, 10 Drawing Sheets

(56) References Cited

OTHER PUBLICATIONS

International Telecommunication Union, "Interfaces for the Optical Transport Network (OTN)," Rec. ITU-T G. 709/Y. 1331, Dec. 2009, pp. 1-218.

Part 3: Carrier Sense Multiple Access with Collision Detection (CSMA/CD) Access Method and Physical Layer Specifications; Amendment 1:Physical Layer and Management Parameters for 10 Gb/s Operation, Type 10GBASE-T, IEEE Computer Society, Sep. 1, 2006. pp. 1-181.

S. Trowbridge, "How can 40 Gb Ethernet be designed to fit existing ODU3 transport?" IEEE HSSG Meeting, San Francisco: Jul. 16-19, 2007, pp. 1-15.

M. Teshima et al., "Bit-Error-Tolerant (512*N)B/(513*N+1)B Code for 40GB/s and 100Gb/s Ethernet Transport." IEEE: 2008, pp. 1-6.

\* cited by examiner

64B/66B block formats

| Input Data | Sync | Block Payload | | | | | | | | |
|---|---|---|---|---|---|---|---|---|---|---|
| Bit Position: | 0 1 | 2 | | | | | | | | 65 |
| Data Block Format: | | $D_0$ | $D_1$ | $D_2$ | $D_3$ | $D_4$ | $D_5$ | $D_6$ | $D_7$ | |
| $D_0 D_1 D_2 D_3 D_4 D_5 D_6 D_7$ | 01 | | | | | | | | | |
| Control Block Formats: | | Block Type Field | | | | | | | | |
| $C_0 C_1 C_2 C_3 C_4 C_5 C_6 C_7$ | 10 | 0x1E | $C_0$ | $C_1$ | $C_2$ | $C_3$ | $C_4$ | $C_5$ | $C_6$ | $C_7$ |
| $S_0 D_1 D_2 D_3 D_4 D_5 D_6 D_7$ | 10 | 0x78 | $D_1$ | $D_2$ | $D_3$ | $D_4$ | $D_5$ | $D_6$ | $D_7$ | |
| $O_0 D_1 D_2 D_3 Z_4 Z_5 Z_6 Z_7$ | 10 | 0x4B | $D_1$ | $D_2$ | $D_3$ | $O_0$ | 0x000_0000 | | | $D_7$ |
| $T_0 C_1 C_2 C_3 C_4 C_5 C_6 C_7$ | 10 | 0x87 | | $C_1$ | $C_2$ | $C_3$ | $C_4$ | $C_5$ | $C_6$ | $C_7$ |
| $D_0 T_1 C_2 C_3 C_4 C_5 C_6 C_7$ | 10 | 0x99 | $D_0$ | | $C_2$ | $C_3$ | $C_4$ | $C_5$ | $C_6$ | $C_7$ |
| $D_0 D_1 T_2 C_3 C_4 C_5 C_6 C_7$ | 10 | 0xAA | $D_0$ | $D_1$ | | $C_3$ | $C_4$ | $C_5$ | $C_6$ | $C_7$ |
| $D_0 D_1 D_2 T_3 C_4 C_5 C_6 C_7$ | 10 | 0xB4 | $D_0$ | $D_1$ | $D_2$ | | $C_4$ | $C_5$ | $C_6$ | $C_7$ |
| $D_0 D_1 D_2 D_3 T_4 C_5 C_6 C_7$ | 10 | 0xCC | $D_0$ | $D_1$ | $D_2$ | $D_3$ | | $C_5$ | $C_6$ | $C_7$ |
| $D_0 D_1 D_2 D_3 D_4 T_5 C_6 C_7$ | 10 | 0xD2 | $D_0$ | $D_1$ | $D_2$ | $D_3$ | $D_4$ | | $C_6$ | $C_7$ |
| $D_0 D_1 D_2 D_3 D_4 D_5 T_6 C_7$ | 10 | 0xE1 | $D_0$ | $D_1$ | $D_2$ | $D_3$ | $D_4$ | $D_5$ | | $C_7$ |
| $D_0 D_1 D_2 D_3 D_4 D_5 D_6 T_7$ | 10 | 0xFF | $D_0$ | $D_1$ | $D_2$ | $D_3$ | $D_4$ | $D_5$ | $D_6$ | |

Figure 1

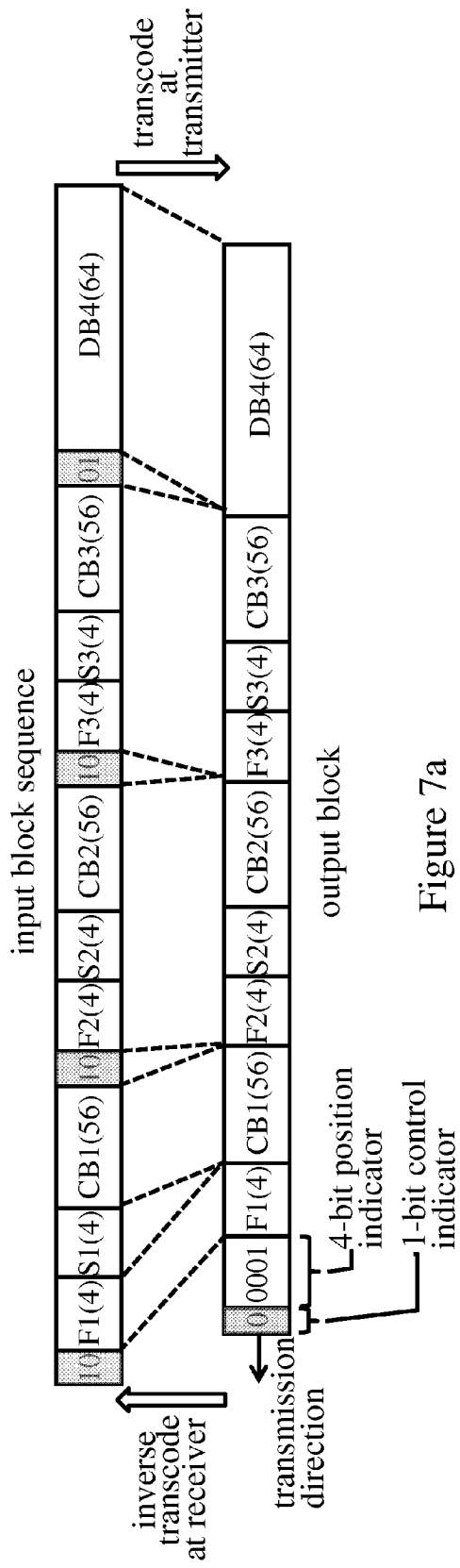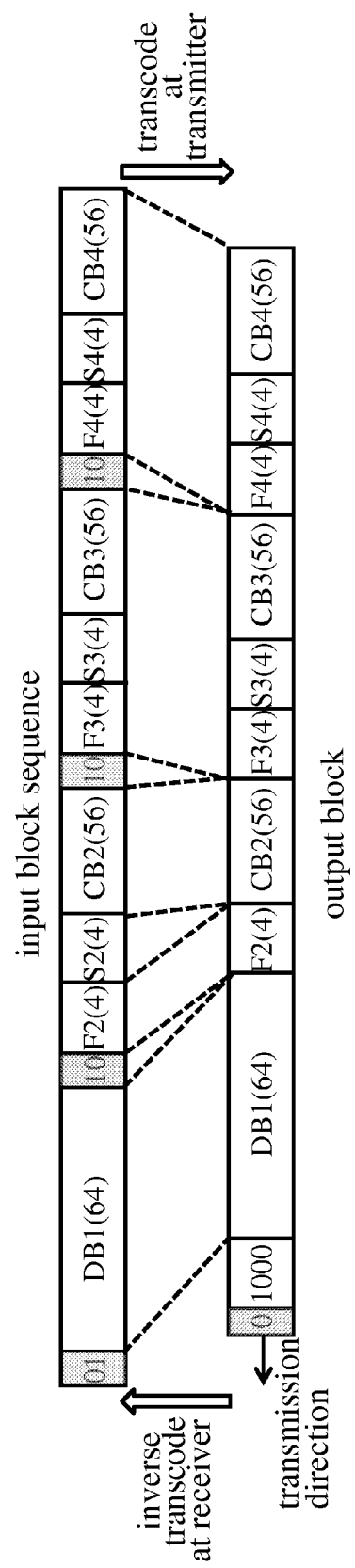
Figure 7a
Figure 7b

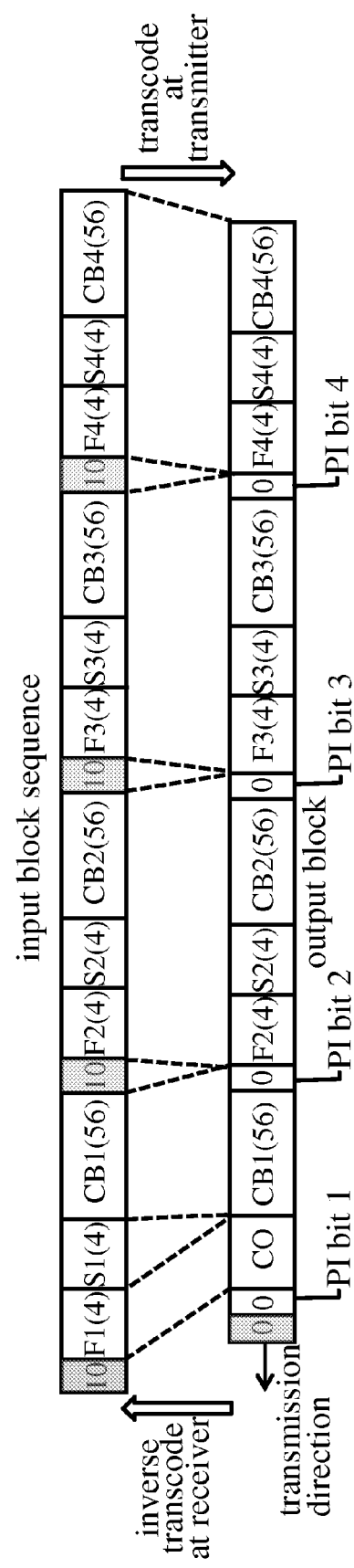

| BTF | 0x1E | 0x78 | 0x4B | 0x87 | 0x99 | 0xAA | 0xB4 | 0xCC | 0xD2 | 0xE1 | 0xFF |
|---|---|---|---|---|---|---|---|---|---|---|---|
| CB-type code CO | 0000 | 1100 | 0011 | 1000 | 0110 | 0010 | 0001 | 1110 | 1101 | 1011 | 0111 |

US 8,898,550 B2

ENCODING OF DATA FOR TRANSMISSION

PRIORITY

This application claims priority to European Patent Application No. 12173638.3, filed Jun. 26, 2012, and all the benefits accruing therefrom under 35 U.S.C. §119, the contents of which in its entirety are herein incorporated by reference.

BACKGROUND

This invention relates generally to encoding of data for transmission over data communications networks.

Data to be transmitted over a communications network is commonly encoded in order to improve transmission characteristics, e.g. to improve data recovery rates and/or compress data for higher data transfer rates. In high-speed interconnect technologies such as 10 Gb/s, 40 Gb/s and 100 Gb/s Ethernet, InfiniBand, and 10-, 16- and 20-gigabit fiber channel, data is formatted in 64-bit blocks which undergo various stages of encoding and other processing prior to transmission. For example, an encoding stage employs a rate-64/66 modulation code. This code is a block code with the redundancy of two header bits per 64-bit payload. The 64-bit payload of each 66-bit block is either a control block, containing control information for the transmission process, or a data block containing actual data (i.e. user data, CRC (cyclic redundancy check) data and other "non-control" data). The 2-bit header of the 66-bit block indicates whether the attached payload is a data block or a control block. The 66-bit blocks are then subject to additional processing before transmission. For example, the payload of encoded blocks may be distributed over multiple channels, or "lanes", for transmission over the network link after forward error correction (FEC) and insertion of alignment markers for block recovery at the receiver.

The particular format of data and control blocks is defined by the appropriate transmission protocol. In general, different types of control block are defined for use in the system, and each control block includes a dedicated field which indicates the type of that control block. This field, referred to herein as a "block-type field", may contain one of a predefined set of K bit-patterns each corresponding to a respective one of K different types of control block used in the transmission system. In 100 Gb/s Ethernet as defined in IEEE 802.3ba-2010, for example, the block format is shown in FIG. 1 of the accompanying drawings. The left-hand column of this table indicates the eight data or control "characters" (represented by letters D, C, O, S or T with suffix 0 to 7 denoting position in the block format) of data and control blocks. The rest of the table indicates the 66-bit output block format for the rate 64/66 modulation code. The 66-bit format for data blocks is shown at the top of the table. This starts with the 2-bit header 01 indicating that the 64-bit payload is a data block. There are eleven different types of control block in this instance and the 66-bit format for these is as indicated beneath the data block format. In each case this starts with the 2-bit header 10 indicating that the 64-bit payload is a control block. The control block commences with an 8-bit block-type field. This contains a bit-pattern representing one of eleven different values, indicated in hexadecimal in the column headed "Block Type Field", for the eleven different types of control block. The set of eleven 8-bit patterns constitute a rate-4/8 code, with Hamming distance 4, for indicating the eleven different types of control block. In control blocks containing a character denoted by S, T and O, this character is implied by the block type field. The control blocks containing the character T or O give rise to zero padding bits as indicated by vertical lines and 0x000_0000 in the figure. The hexadecimal number 0x000_0000 corresponds to the 28-bit all-zero pattern.

The transmission-side processing of blocks may include an encoding stage designed to increase data rates via compression. This encoding process is often referred to as "transcoding". The corresponding decoding process on the receiver side is referred to herein as "inverse transcoding". In the applications discussed above, for example, transcoding can be used to transform a group of N data or control blocks into a single output block for transmission (typically after some additional processing) over the communications link. For instance, N 66-bit blocks generated by the rate 64/66 modulation encoder may be converted into a single (N*64+L)-bit block. Note that if L<2N, this transcoding process always results in compression. Existing fixed-rate transcoding schemes of this type, reshuffle (rearrange) the order of the incoming blocks in order to achieve compression. An example is described in "FEC Proposal for NRZ-Based 100G-KR Systems", Zhongfeng Wang, Broadcom, Feb. 8, 2012. The operation of this transcoding scheme is illustrated in FIG. 2 of the accompanying drawings. The left-hand side of this figure illustrates a sequence of N=4 66-bit blocks, consisting of two data blocks (header 01) alternating with two control blocks (header 10), where "Ca" and "Cb" represent the 8-bit block-type field of the control blocks here. The output block of the transcoding process is formatted as shown on the right-hand side of the figure. The output block consists of 257 bits commencing with a single sync bit 0 shown in the upper left corner of the block. The remainder of the block is constructed by deleting all 2-bit headers from the input blocks. All input control blocks are grouped together at the start of the output block, after the sync bit. The block-type field of each control block is replaced by an 8-bit field denoted by Ta and Tb in the figure. This field consists of a 1-bit flag F, a 3-bit position field POS, and a 4-bit code field CBT. The flag F indicates whether the next (i.e. after the current) block is a control block (F=1) or a data block (F=0). The code field CBT is a 4-bit encoding indicating the control block type. The POS field consists of a 2-bit position index which indicates the original position of the current control block in the sequence of four input blocks, and 1-bit parity information. The 1-bit parity is chosen as the parity of the 1-bit flag F, the 2-bit position index and the 4-bit CBT code. After deletion of the input block header bits, this scheme effectively applies a rate 256/257 code to the four 64-bit data and control blocks at the input. Similar transcoding schemes, based on a rate 512/513 code, have been proposed to convert eight incoming 66-bit blocks, each with 64-bit payload, into a single 513-bit transcoded block.

The above transcoding schemes incur a latency penalty corresponding to the size of the N-block sequence on both the transmitter and receiver sides due to the need to reorder data and control blocks during transcoding and inverse transcoding. For example, assuming a data rate of 25 Gb/s, the aforementioned 512 bit/513 bit transcoding of successive sequences of eight input blocks results in a latency of about 20.5 ns on both the transmitter and receiver sides. Link latency is a parameter that is of critical importance in link design. One of the requirements for 100 Gb/s transmission over backplane and copper cable currently being standardized by the IEEE 802.3bj task force is that the architecture should allow implementation of the transcoding/FEC scheme with a total latency of less than 100 ns. Reduction of latency associated with transcoding is therefore desirable.

SUMMARY

In one embodiment, a data encoding method for encoding a sequence of N input blocks of bits into an output block for transmission, wherein each input block comprises one of a data block and a control block, the control block being one of K types of control block and including a block-type field indicating the type of that control block, includes: adding an L-bit control indicator, indicating whether the sequence contains any control blocks, as a header to the sequence; and if the sequence contains any control blocks, producing an output block in which the order of data and control blocks in the sequence is preserved by deleting a set of bits from the block-type field of at least one control block, adding to the sequence an N-bit position indicator indicating positions of data and control blocks in the sequence, and providing in bit positions of remaining bits of the block-type field of the at least one control block an indication of the type of that control block; wherein the position indicator bits are added at bit-positions such that, in a header-first transmission order of the output block, all data and control blocks succeed the position indicator bits indicating positions of those blocks.

In another embodiment, a method for communicating data over a data communications network includes receiving a sequence of N input blocks of bits wherein each input block comprises one of a data block and a control block, the control block being one of K types of control block and including a block-type field indicating the type of that control block; encoding the sequence into an output block by adding an L-bit control indicator, indicating whether the sequence contains any control blocks, as a header to the sequence, and, if the sequence contains any control blocks, producing an output block in which the order of data and control blocks in the sequence is preserved by deleting a set of bits from the block-type field of at least one control block, adding to the sequence an N-bit position indicator indicating positions of data and control blocks in the sequence, and providing in bit positions of remaining bits of the block-type field of the at least one control block an indication of the type of that control block, wherein the position indicator bits are added at bit-positions such that, in a header-first transmission order of the output block, all data and control blocks succeed the position indicator bits indicating positions of those blocks; transmitting the output block over the network to a receiver; and at the receiver, processing the output block in the header-first transmission order to decode the sequence of N input blocks.

In another embodiment, a data encoding method for encoding a sequence of N input blocks of bits into an output block for transmission, wherein each input block comprises one of a data block and a control block, the control block being one of K types of control block and including a block-type field indicating the type of that control block, the method comprising sequentially processing the input blocks in the sequence to produce the output block by: if the sequence contains any control blocks, deleting a set of bits from the block-type field of the first control block in the sequence, and providing in bit positions of remaining bits of that block-type field an indication of the type of the first control block; on processing the Nth input block, adding to the sequence an L-bit control indicator indicating whether the sequence contains any control blocks; and on processing the Nth input block, if the sequence contains any control blocks, adding to the sequence an N-bit position indicator indicating positions of data and control blocks in the sequence.

In another embodiment, a data encoding apparatus for encoding a sequence of N input blocks of bits into an output block for transmission, wherein each input block comprises one of a data block and a control block, the control block being one of K types of control block and including a block-type field indicating the type of that control block, the apparatus comprising an input buffer for receiving the sequence of input blocks, and an encoder for producing the output block from the sequence by: adding an L-bit control indicator, indicating whether the sequence contains any control blocks, as a header to the sequence; and if the sequence contains any control blocks, producing an output block in which the order of data and control blocks in the sequence is preserved by deleting a set of bits from the block-type field of at least one control block, adding to the sequence an N-bit position indicator indicating positions of data and control blocks in the sequence, and providing in bit positions of remaining bits of the block-type field of the at least one control block an indication of the type of that control block; wherein the position indicator bits are added at bit-positions such that, in a header-first transmission order of the output block, all data and control blocks succeed the position indicator bits indicating positions of those blocks.

In another embodiment, a data encoding apparatus for encoding a sequence of N input blocks of bits into an output block for transmission, wherein each input block comprises one of a data block and a control block, the control block being one of K types of control block and including a block-type field indicating the type of that control block, the apparatus comprising an input buffer for sequentially receiving the input blocks in the sequence, and an encoder for sequentially processing the input blocks to produce the output block by: if the sequence contains any control blocks, deleting a set of bits from the block-type field of the first control block in the sequence, and providing in bit positions of remaining bits of that block-type field an indication of the type of the first control block; on processing the Nth input block, adding to the sequence an L-bit control indicator indicating whether the sequence contains any control blocks; and on processing the Nth input block, if the sequence contains any control blocks, adding to the sequence an N-bit position indicator indicating positions of data and control blocks in the sequence.

BRIEF DESCRIPTION OF THE SEVERAL VIEWS OF THE DRAWINGS

Exemplary embodiments of the invention are described below, by way of illustrative and non-limiting examples, with reference to the accompanying drawings in which:

FIG. 1 indicates the format of data and control blocks as currently specified for 100 Gb/s Ethernet;

FIGS. 7a through 7d indicate operation of the transcoding process for respective further sequences of input blocks;

FIG. 8 indicates mapping between nibbles of block-type fields in the control block format of FIG. 1;

FIGS. 9a and 9b indicate operation of a second transcoding process for respective sequences of input blocks;

FIG. 10 illustrates an exemplary control block-type code for use in the embodiment of FIGS. 9a and 9b.

DETAILED DESCRIPTION

Figure 2:
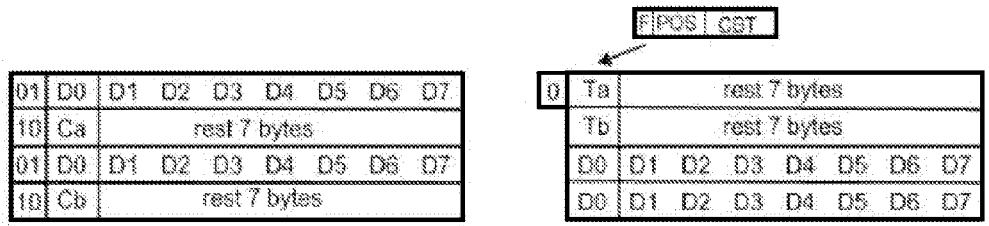
FIG. 2 illustrates operation of a prior transcoding process based on reordering of data and control blocks.

An embodiment of a first aspect of the present invention provides a data encoding method for encoding a sequence of N input blocks of bits into an output block for transmission, wherein each input block comprises one of a data block and a control block, the control block being one of K types of control block and including a block-type field indicating the type of that control block. The method includes: adding an L-bit control indicator, indicating whether the sequence contains any control blocks, as a header to the sequence; and if the sequence contains any control blocks, producing an output block in which the order of data and control blocks in the sequence is preserved by deleting a set of bits from the block-type field of at least one control block, adding to the sequence an N-bit position indicator indicating positions of data and control blocks in the sequence, and providing in bit positions of remaining bits of the block-type field of the at least one control block an indication of the type of that control block; wherein the position indicator bits are added at bit-positions such that, in a header-first transmission order of the output block, all data and control blocks succeed the position indicator bits indicating positions of those blocks.

Data encoding methods embodying the invention can be used in transcoding processes to reduce the overall latency associated with transcoding and inverse transcoding. Because the order of data and control blocks in the input block sequence is preserved in the output block, the N-block latency associated with reordering of blocks during inverse transcoding can be avoided. The L-bit control indicator, indicating whether the sequence contains any control blocks, provides a header for the output block transmitted to the receiver. The position indicator bits, which indicate positions of data and control blocks in the sequence as preserved in the output block, are added at bit-positions such that, in a header-first transmission order, all data and control blocks succeed the position indicator bits indicating positions of those blocks. Thus, the position indicator bit(s) which indicate position of any particular block are ahead of that block in the transmission order. The output block can therefore be sequentially processed by the inverse transcoder, e.g. bitwise from the L-bit header, to decode the original sequence of N input blocks without waiting for receipt of the entire output block before decoding. In this way, latency associated with inverse transcoding can be reduced or even eliminated, providing an overall reduction in latency of up to about 50% for the transcoding/inverse transcoding process.

In producing the output block, a set of bits is deleted from the block-type field of at least one control block. However, the encoding method provides an indication of the type of that (at least one) control block in bit positions of remaining bits of the block-type field. Providing this indication may or may not involve additional action after the deletion of bits. Some embodiments may replace the remaining bits by code-bits indicating control block type. In other embodiments, however, the remaining bits of the block type field may be sufficient to indicate control block type. In the block format of FIG. 1, for instance, the 8-bit block type field is a rate-4/8 encoding of K=11 possible values with a Hamming distance of 4. In this case, either the first or second nibble (i.e. 4 bits) of the block-type field is sufficient in itself to identify control block type. Hence, one nibble can be deleted from a block-type field leaving the remaining nibble to indicate control block type. In this and similar scenarios, redundancy in the control block field can be exploited to allow addition of position indicator bits while still achieving good compression rates. In further exemplary embodiments, a set of N bits are deleted from the block-type field to permit addition of the N-bit position indicator without increasing bit numbers.

As in the examples described earlier, each input block may include an x-bit input block header. The encoding method may then include deleting the input block headers from the sequence of input blocks. In this case, if N bits are deleted from the aforementioned block type field as discussed above, compression is achieved for transcoding provided L<xN.

While the above methods may reduce latency on the receiver side, similar principles can be applied in other encoding methods to reduce latency on the transmitter side. In particular, an embodiment of a second aspect of the invention provides a data encoding method for encoding a sequence of N input blocks of bits into an output block for transmission, wherein each input block comprises one of a data block and a control block, the control block being one of K types of control block and including a block-type field indicating the type of that control block. The method comprises sequentially processing the input blocks in the sequence to produce the output block by: if the sequence contains any control blocks, deleting a set of bits from the block-type field of the first control block in the sequence, and providing in bit positions of remaining bits of that block-type field an indication of the type of the first control block; on processing the $N^{th}$ input block, adding to the sequence an L-bit control indicator indicating whether the sequence contains any control blocks; and on processing the $N^{th}$ input block, if the sequence contains any control blocks, adding to the sequence an N-bit position indicator indicating positions of data and control blocks in the sequence.

In methods embodying the second aspect of the invention, the input blocks in the N-block sequence are processed sequentially, e.g., bitwise, to produce the output block, whereby the order of blocks is preserved and latency is reduced on the transmitter side.

An embodiment of a third aspect of the invention provides a method for communicating data over a data communications network. The method includes: receiving a sequence of N input blocks of bits wherein each input block comprises one of a data block and a control block, the control block being one of K types of control block and including a block-type field indicating the type of that control block; encoding the sequence into an output block by adding an L-bit control indicator, indicating whether the sequence contains any control blocks, as a header to the sequence, and, if the sequence contains any control blocks, producing an output block in which the order of data and control blocks in the sequence is preserved by deleting a set of bits from the block-type field of at least one control block, adding to the sequence an N-bit position indicator indicating positions of data and control blocks in the sequence, and providing in bit positions of remaining bits of the block-type field of the at least one control block an indication of the type of that control block, wherein the position indicator bits are added at bit-positions such that, in a header-first transmission order of the output block, all data and control blocks succeed the position indicator bits indicating positions of those blocks; transmitting the output block over the network to a receiver; and at the receiver, processing the output block in the header-first transmission order to decode the sequence of N input blocks.

An embodiment of a fourth aspect of the invention provides data encoding apparatus for encoding a sequence of N input blocks of bits into an output block for transmission, wherein each input block comprises one of a data block and a control block, the control block being one of K types of control block and including a block-type field indicating the type of that control block. The apparatus comprises an input buffer for receiving the sequence of input blocks, and an encoder for producing the output block from the sequence by: adding an L-bit control indicator, indicating whether the sequence contains any control blocks, as a header to the sequence; and if the sequence contains any control blocks, producing an output block in which the order of data and control blocks in the sequence is preserved by deleting a set of bits from the block-type field of at least one control block, adding to the sequence an N-bit position indicator indicating positions of data and control blocks in the sequence, and providing in bit positions of remaining bits of the block-type field of the at least one control block an indication of the type of that control block; wherein the position indicator bits are added at bit-positions such that, in a header-first transmission order of the output block, all data and control blocks succeed the position indicator bits indicating positions of those blocks.

An embodiment of a fifth aspect of the invention provides data encoding apparatus for encoding a sequence of N input blocks of bits into an output block for transmission, wherein each input block comprises one of a data block and a control block, the control block being one of K types of control block and including a block-type field indicating the type of that control block. The apparatus comprises an input buffer for sequentially receiving the input blocks in the sequence, and an encoder for sequentially processing the input blocks to produce the output block by: if the sequence contains any control blocks, deleting a set of bits from the block-type field of the first control block in the sequence, and providing in bit positions of remaining bits of that block-type field an indication of the type of the first control block; on processing the $N^{th}$ input block, adding to the sequence an L-bit control indicator indicating whether the sequence contains any control blocks; and on processing the $N^{th}$ input block, if the sequence contains any control blocks, adding to the sequence an N-bit position indicator indicating positions of data and control blocks in the sequence.

In general, where features are described herein with reference to an embodiment of one aspect of the invention, corresponding features may be provided in embodiments of another aspect of the invention as appropriate. For example, where features are described herein with reference to a method embodying the invention, corresponding features may be provided in apparatus embodying the invention, and vice versa.

Figure 3:
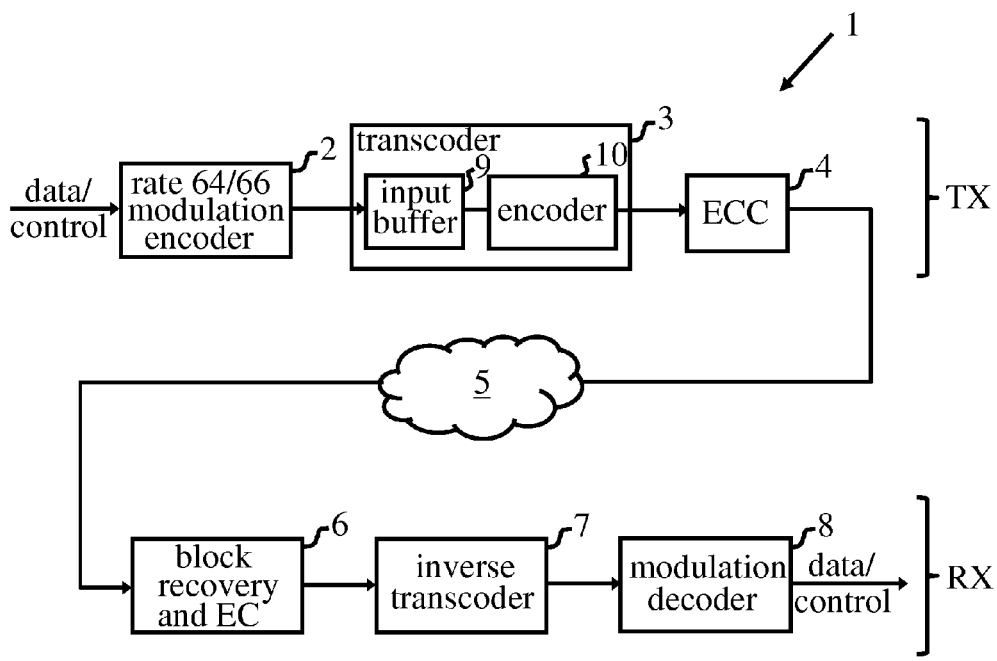
FIG. 3 is a schematic representation of a data communications system embodying the invention.

FIG. 3 is a simplified schematic of a data communications system 1 in which transcoding methods embodying the invention can be employed. Communications system 1 may be embodied in a 100 Gb/s Ethernet system as currently defined in standard IEEE 802.3bj for example. A transmitter TX of system 1 comprises a modulation encoder 2, a transcoder 3 and an error correction coder (ECC) 4 for processing data to be transmitted over a communications network 5. A receiver RX of the system comprises a block recovery and error correction (EC) module 6, an inverse transcoder 7 and a modulation decoder 8.

In operation of system 1, 64-bit blocks of data and control characters are encoded by modulation encoder 2 into 66-bit blocks. Each 66-bit block has a 2-bit header and comprises either a data block or a control block as described earlier with reference to FIG. 1. The 66-bit blocks from modulation encoder 2 are supplied to transcoder 3 and received by an input buffer 9 of the transcoder. A sequence of N input 66-bit blocks is stored in buffer 9 for the transcoding operation. Encoder 10 of transcoder 3 encodes the sequence of N input blocks into a single (N*64+L)-bit output block as described in detail below. Encoder 10 could be implemented, in general, in hardware or software or a combination thereof, but is conveniently implemented in hardwired logic. Suitable implementations will be readily apparent to those skilled in the art from the description herein. Output blocks from transcoder 3 are transmitted over network 5 after forward error correction processing in ECC module 4. (In practice, blocks processed by transmitter TX may be subject to various other processing stages not indicated in the figure for simplicity. According to current 100 Gb/s Ethernet specifications, for example, encoded blocks may be distributed over multiple "lanes", with markers for block synchronization purposes, prior to transmission over the physical link).

On receipt by receiver RX, transcoded blocks are recovered in module 6 and supplied, after error-correction processing, to inverse transcoder 7. The inverse transcoder 7 decodes each (N*64+L)-bit transcoded block into the original sequence of N 66-bit blocks as described further below. The 66-bit blocks are output to modulation decoder 8 which performs the inverse of the rate 64/66 code in modulation encoder 2 to recover the data and control characters originally input on the transmitter side of system 1.

In the particular example to be described, N=4 for the transcoding operation. Hence, a sequence of four 66-bit input blocks received by buffer 9 of the transcoder are processed by encoder 10 to produce a (256+L)-bit output block. The main blocks of this transcoding operation are indicated in the flow chart of FIG. 4. Operation begins at block 20 when the sequence of four input blocks have been received by buffer 9. In block 21, encoder 10 determines from the 2-bit input block headers whether any of the four input blocks comprises a control block (CB). If not ("N" at decision block 21), i.e. if all input blocks comprise data blocks, then operation proceeds to block 22. In this block, encoder 10 deletes the 2-bit input block headers from each input block in the four-block sequence. Next, an L-bit control indicator is added as a header to the sequence in block 23. The control indicator is set to indicate whether the output block contains any control blocks. In this instance there are no control blocks in the input block sequence, so the control indicator is set to indicate that the output block contains no control blocks. The bit-sequence resulting from blocks 22 and 23 constitutes the transcoded block which is then output in block 24 for transmission in a header-first transmission order. That is, the designated transmission order of the bits of the transcoded output block starts with bit 1 of the L-bit control indicator which provides the output block header.

Figure 4:
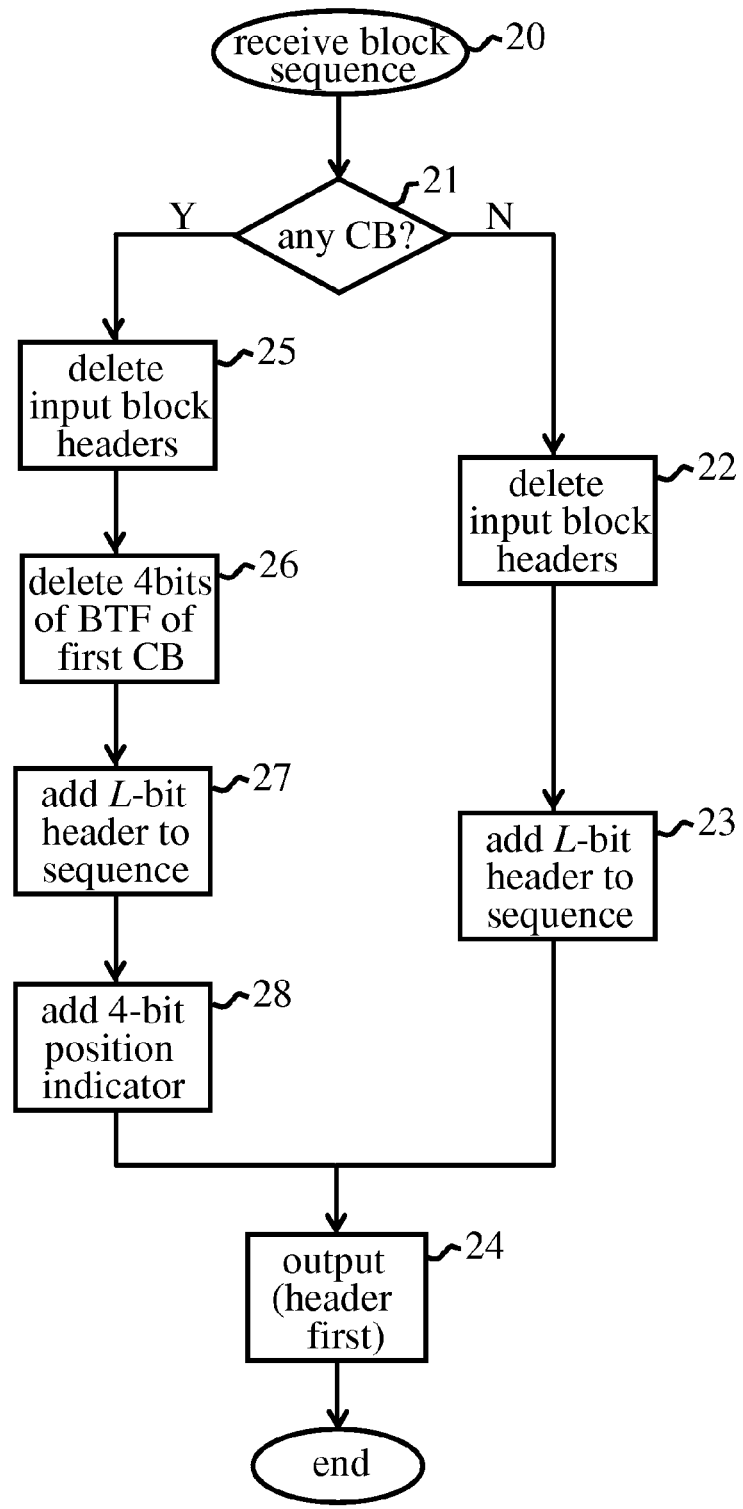
FIG. 4 indicates blocks of a first transcoding process in the FIG. 3 system.

Returning to block 21 of FIG. 4, if it is determined from the input block headers that the input block sequence contains any control blocks ("Y" at decision 21), then operation proceeds to block 25 wherein encoder 10 deletes the 2-bit input block headers from all input blocks as before. Next, in block 26, encoder 10 deletes four bits from the block-type field (BTF) of the first (or only) control block in the input block sequence. In this embodiment, the remaining bits of the block-type field are sufficient to indicate control block-type as discussed further below. In block 27, the L-bit control indicator is added as a header to the sequence to indicate, in this instance, that the output block contains at least one control block. In block 28, the encoder 10 adds a 4-bit position indicator to the sequence. This position indicator indicates the positions of data and control blocks in the sequence. The position indicator bits are added at bit-positions such that, in the header-first transmission order of the output block, all data and control blocks succeed the position indicator bits which indicate positions of those blocks. This is explained further below. The resulting bit-sequence provides the transcoded output block which is then output in block 24 as before. The transcoding process is then complete.

Figure 5A:
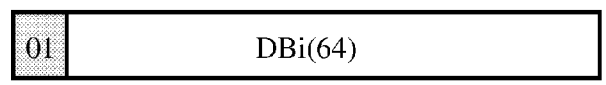
FIGS. 5a and 5b show the input block formats for the transcoding process.
Figure 5B:
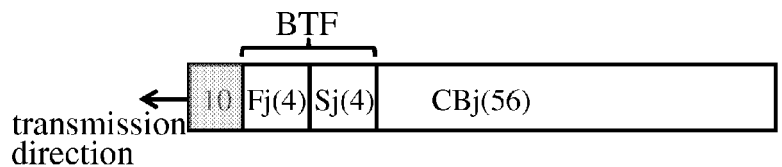

A particular example of the above transcoding operation will be described with reference to FIGS. 5a to 8. The notation employed for the 66-bit input block format is indicated in FIG. 5a for a data block and FIG. 5b for a control block. In particular, a data block #i has the 2-bit input block header 01 and comprises 64 bits of data denoted by DBi(64). A control block #j has the 2-bit input block header 10 and comprises an 8-bit block-type field (BTF) followed by 56 control bits denoted by CBj(56). The block-type field comprises an 8-bit pattern representing one of K=11 hexadecimal values indicative of control block-type as indicated in FIG. 1. In this system, the least-significant bit (LSB) of the block-type field is the first transmitted bit. For example, the block-type field 0x1E (binary value 00011110) is represented in a left-to-right transmission order of the control block as the BTF bit-pattern 01111000. The BTF of control block #j is represented in FIG. 5b as a concatenation of the first 4-bit nibble Fj(4) and the second 4-bit nibble Sj(4) of the BTF bit-pattern. For example, for the BTF value 0x1E, we obtain Fj(4)=0111 and Sj(4)= 1000 for the transmission direction shown in FIG. 5b.

Figure 6A:
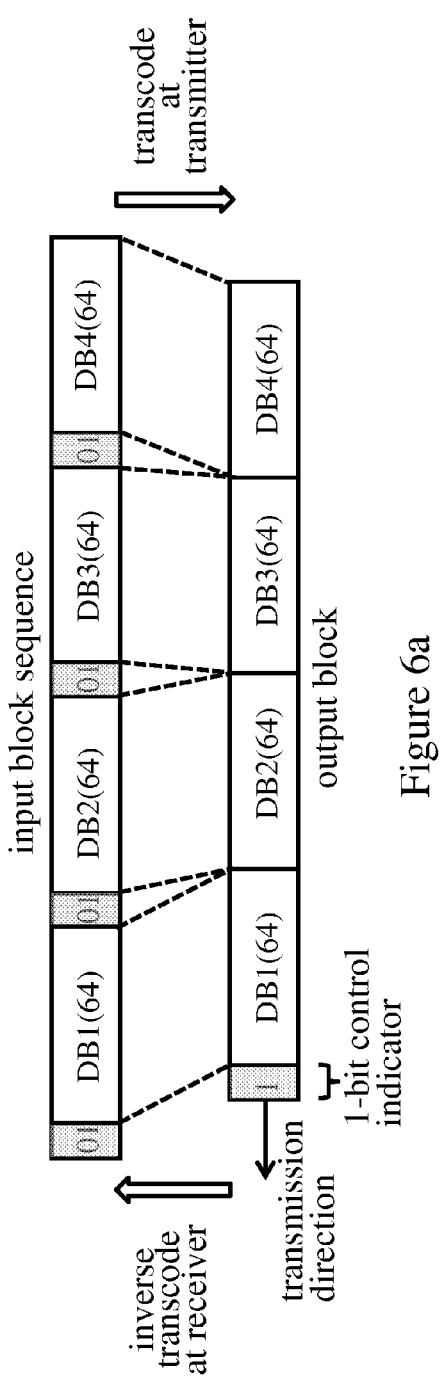
FIGS. 6a and 6b indicate operation of the transcoding process for respective sequences of input blocks.

FIG. 6a indicates operation of the transcoding method for an input block sequence comprising only data blocks, i.e. DB#1, DB#2, DB#3, and DB#4. The input block sequence is shown at the top of the figure and the transcoded output block is shown at the bottom. As illustrated here, all input block headers are deleted as per block 22 of FIG. 4. In this embodiment, an (L=1)-bit control indicator is added in block 23 of FIG. 4. A control indicator value "1" here indicates no control blocks in the output block, and a control indicator value "0" indicates that the output block contains at least one control block.

Figure 6B:
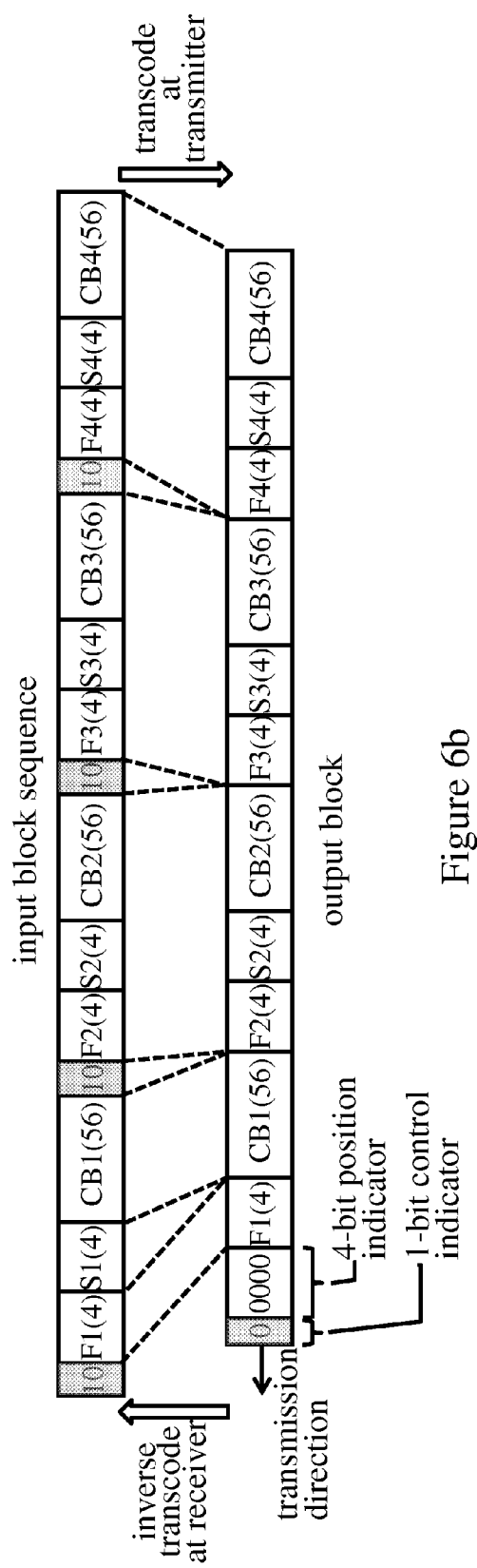

FIG. 6b indicates the transcoding operation for an input block sequence comprising only control blocks, i.e. CB#1, CB#2, CB#3, and CB#4. All input block headers are deleted as per block 25 of the FIG. 4 process. The second nibble S1(4) of the first control block CB#1 is deleted corresponding to block 26 of FIG. 4. The 1-bit control indicator "0" is added as a header to the sequence in block 27. In this embodiment, the 4-bit position indicator added in block 28 is inserted at four bit-positions immediately following the control indicator. In this case, therefore, the position indicator precedes all data and control blocks in the header-first transmission order of the output block corresponding to the transmission direction indicated in the figure. The position indicator here effectively comprises four 1-bit flags, one for each block in the ensuing sequence, to indicate whether that block is a data block (1) or a control block (0). In this way, the position indicator bits indicate the positions of data and control blocks in the block order of the sequence. In this case, the position indicator is 0000 indicating that all of the following blocks are control blocks.

Figure 7C:
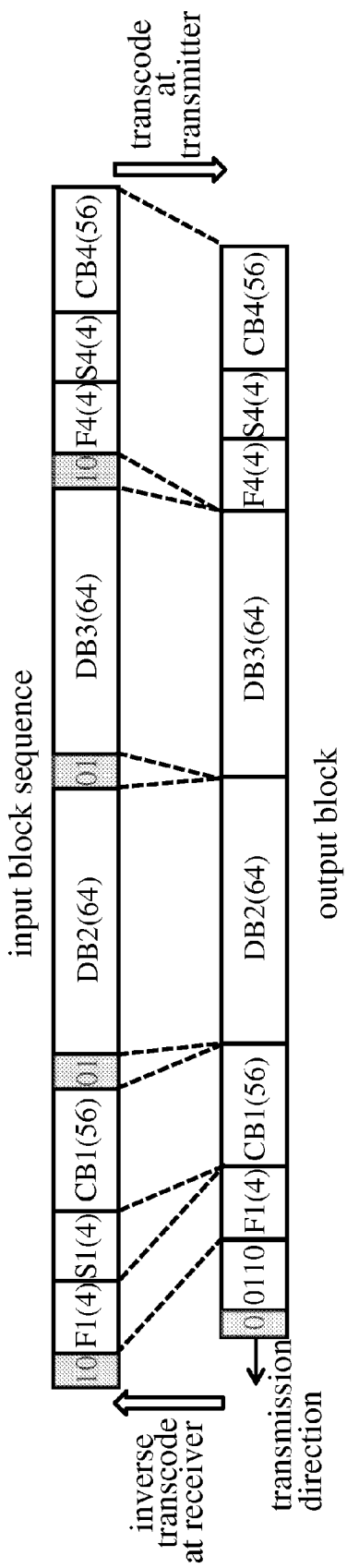
Figure 7D:
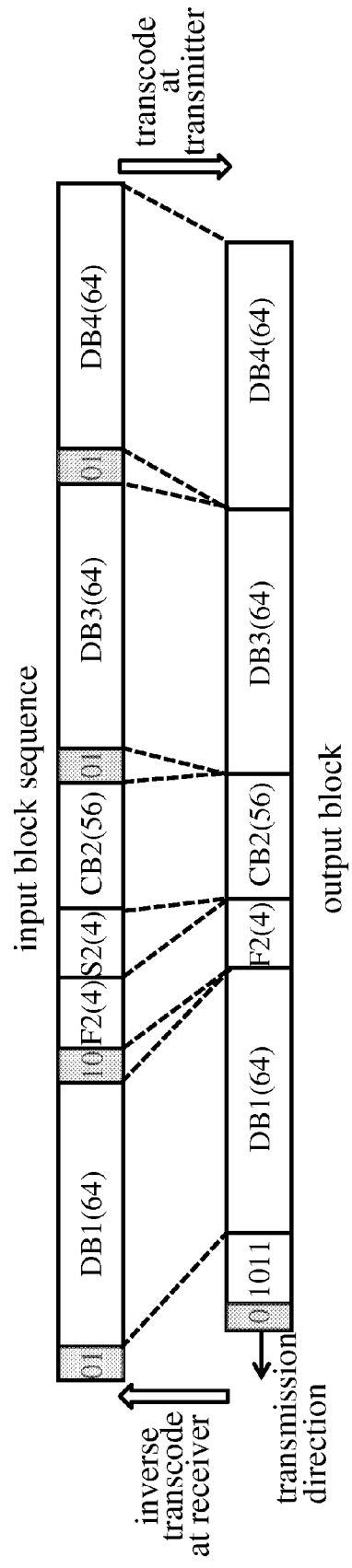

FIGS. 7a through 7d illustrate operation of the above transcoding process for respective further sequences of input blocks. FIG. 7a corresponds to an input block sequence CB#1, CB#2, CB#3, and DB#4. FIG. 7b corresponds to an input block sequence DB#1, CB#2, CB#3, and CB#4. FIG. 7c corresponds to an input block sequence CB#1, DB#2, DB#3, and CB#4. FIG. 7d corresponds to an input block sequence DB#1, CB#2, DB#3, and DB#4. The same basic process blocks described above and illustrated in these figures can be used to generate transcoded output blocks for all other possible input block sequences.

As indicated by the vertical arrows in FIGS. 6a to 7d, the inverse transcoding process performed by inverse transcoder 7 in FIG. 3 involves addition and deletion of bits to reverse the transcoding process. It will be apparent from consideration of the figures that transcoded blocks can be processed by inverse transcoder 7, in their header-first transmission order, to decode the original sequence of four input blocks without waiting for receipt of the entire output block. The 1-bit control indicator, received first as the block header at inverse transcoder 7, indicates whether any control blocks are present. If not, the inverse transcoder can simply add the 2-bit input block headers "01" at appropriate positions in the received bit sequence to reverse the transcoding operation of FIG. 6a. If the presence of at least one control block is indicated by the transcoded block header, then the inverse transcoder can determine the positions of data/control blocks in the ensuing sequence from the 4-bit position indicator received next. The appropriate 2-bit input block header of "10" for a control block and "01" for any data block can then be inserted at the appropriate bit-positions as the bit sequence is received. In addition, the first control block in this sequence can be identified, and the deleted nibble Sj(4) can be inserted at the appropriate location. Specifically, because of the particular selection of the K=11 block-type field values in this example, there is a unique mapping between the two nibbles Fj(4) and Sj(4) of any block-type field. The mapping in this instance is indicated in hexadecimal notation in the table of FIG. 8. Hence, on deletion of a nibble Sj(4) in block 26 of the FIG. 4 transcoding process, the remaining nibble Fj(4) is sufficient to indicate control block-type, whereby the appropriate nibble Sj(4) can be identified and inserted by the inverse transcoder to restore the original block-type field. The transcoded block can therefore be decoded bit-wise in inverse transcoder 7 to recover the original sequence of four 66-bit input blocks for supply to modulation decoder 8.

It will be appreciated from the above that, by preserving the sequence order of input data and control blocks, and by adding the position indicator and control indicator bits at appropriate positions in the sequence, the transcoding system significantly reduces latency inherent in the overall transcoding/inverse transcoding operation. Indeed, the N-block latency associated with inverse transcoding in prior systems can be effectively eliminated, significantly reducing overall latency for transcoding/inverse transcoding.

The unique mapping of FIG. 8 permits indication of control block-type by a single remaining nibble of the block-type field after deletion of bits in block 26 of FIG. 4. In other embodiments, however, after deletion of BTF bits from a control block in block 26, the remaining bits of the BTF may be replaced by code bits to indicate the type of that control block. A second embodiment of the transcoding process employing this system will be described below with reference to FIGS. 9a and 9b.

Figures 9B, 10:
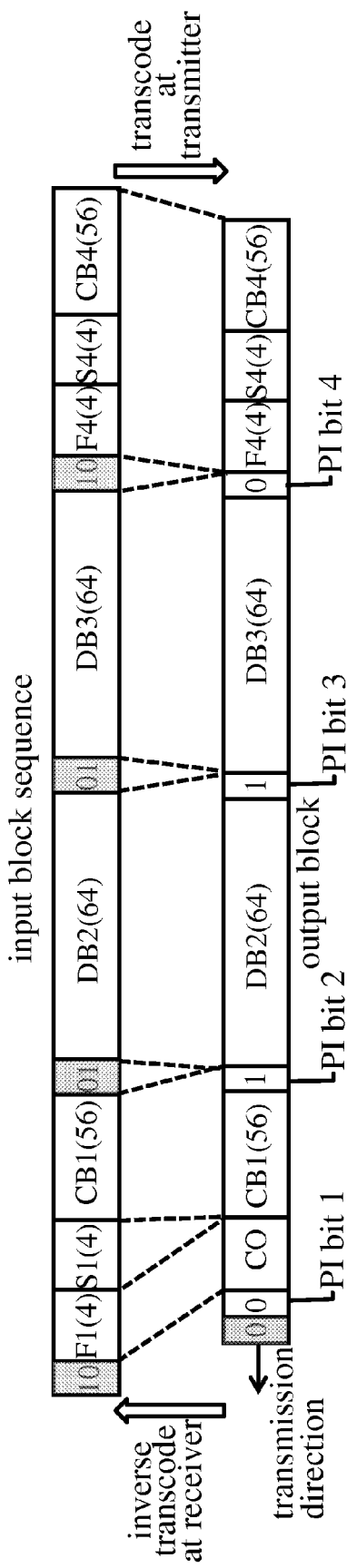

FIG. 9a indicates operation of the second transcoding method for an input block sequence comprising only control blocks: CB#1, CB#2, CB#3, and CB#4. FIG. 9b indicates the operation for an exemplary input block sequence with both data and control blocks: CB#1, DB#2, DB#3, and CB#4. Operation is generally as described above for the first transcoding method and only the key differences will be described here. Firstly, the four position indicator (PI) bits are added at distributed bit-positions, each preceding a respective one of the data and control blocks in the transmission order, to indicate the starting position of that block. Thus, a position indicator bit of value "0" is inserted before each control block in the sequence of FIG. 9a, and before control blocks CB#1 and CB#4 in FIG. 9b. A position indicator bit of value "1" is inserted before each data block DB#2 and DB#3 in FIG. 9b. Secondly, in addition to deleting the second BTF nibble Sj(4) of the first control block in the input sequence, the first BTF nibble Fj(4) is replaced by a 4-bit code CO indicating the type of the associated control block. An exemplary 4-bit code CO for the 11 control block types of this example is indicated in the table of FIG. 10.

The transcoded block format for all other possible input block sequences can be generated using the principles illustrated in FIGS. 9a and 9b. Consideration of this block format illustrates that, as before, inverse transcoder 7 can process transcoded blocks bit-wise in their header-first transmission order to decode the original sequence of four input blocks. Each data/control block succeeds the particular PI bit indicating position of that block to the inverse transcoder, and can thus be identified and processed appropriately to recover the corresponding input block. In addition, the control code CO of the first (or only) control block in the sequence can be identified by inverse transcoder 7 and replaced by the appropriate block type field via the mapping of FIG. 10. Hence, the latency associated with inverse transcoding in prior systems is avoided as before.

The transcoding methods described above achieve good compression rates by exploiting all of the N-bit redundancy in the BTF field of control blocks for insertion of the N-bit position indictor. In general, for K control block-types with an 8-bit BTF as here, this can be achieved when $N \leq 8 - \text{ceiling}(\log_2 K)$ where ceiling(y) is the smallest integer n larger than or equal to the real number y. Note that the block-type fields of any second and subsequent control blocks in an input sequence are left unchanged and therefore these fields are still protected by the distance-4 Hamming code. In addition, with the code of FIG. 10, all control blocks containing a termination character T (i.e. the eight control blocks #4 to #11 in FIG. 1) are assigned a 4-bit code CO with odd weight (odd parity) as indicated by the shading in FIG. 10. An alternative would be to assign these control blocks codes CO with even weight (even parity). Either way, this ensures a Hamming distance of 2 between all eight 4-bit codes for control blocks containing a termination block.

The above transcoding methods convert four input 66-bit blocks, each with a 64-bit payload, into an output (4*64+1)-bit block. Excluding input block header bits, therefore, this can be viewed as a rate 256/257 encoding of the input data and control blocks. In a modification to these processes, an (L=2)-bit control indicator may be employed as the output block header to implement a rate 256/258 code. Various other modifications to the above embodiments can be envisaged. For example, the first nibble Fj(4) of the first control block could be deleted in block 26 of FIG. 4 instead of the second nibble Sj(4). Where the input block sequence contains more than one control block, predetermined bits could in general be deleted from the block-type field of any one or more control blocks provided an appropriate algorithm is defined in the inverse transcoder to permit decoding. In addition, while the 4-bit PI pattern in FIGS. 6b to 7d consists of a simple 1-bit flag for each data/control block, other mappings between 4-bit PI patterns and data/control block orders can be envisaged. The exemplary embodiments described above, however, provide particularly simple and efficient implementations. It will of course be appreciated that the various blocks of the transcoding processes described can be performed in any convenient order, and different blocks may be performed wholly or partially in parallel by encoder 10 as appropriate. Embodiments can also be envisaged where the encoding process is performed by encoder 10 for input data and control blocks without the input block headers described above. The input block length and number N of blocks in the input sequence may of course differ in other embodiments.

Figure 11A:
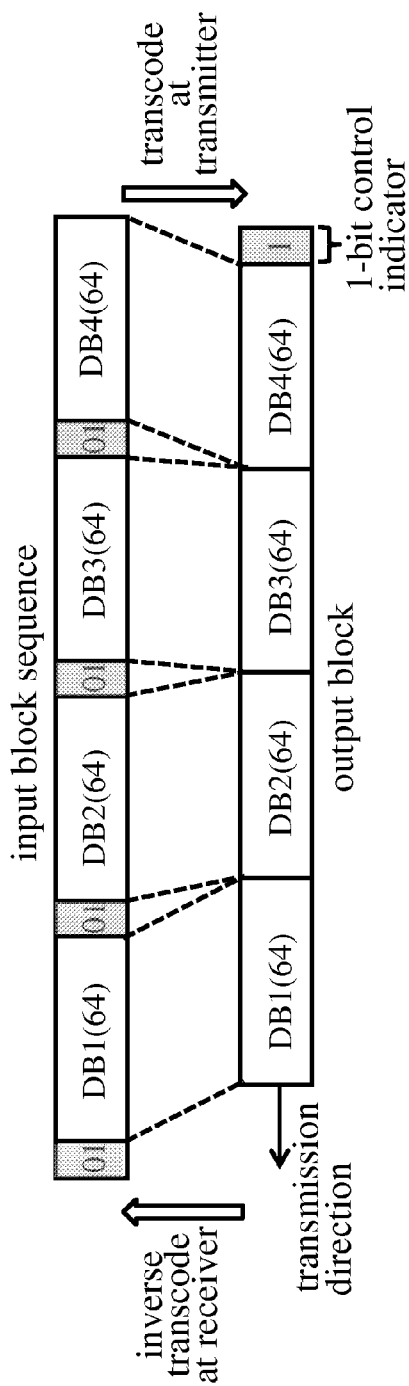
FIGS. 11a through 11c indicate operation of an alternative transcoding process embodying the invention.
Figure 11B:
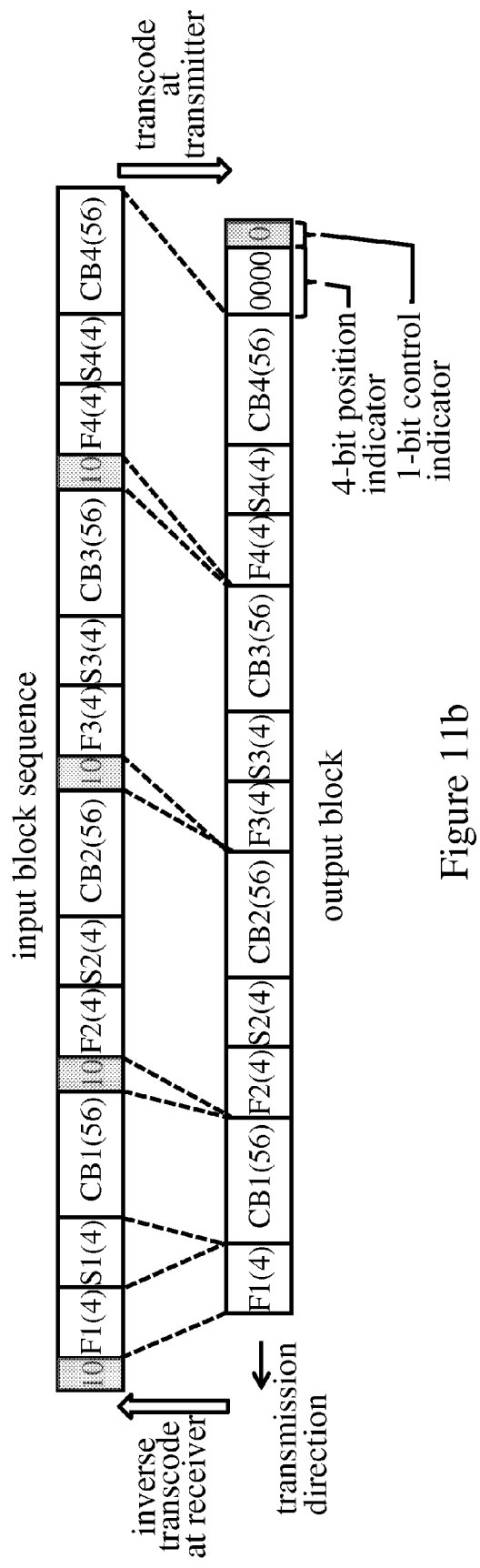
Figure 11C:
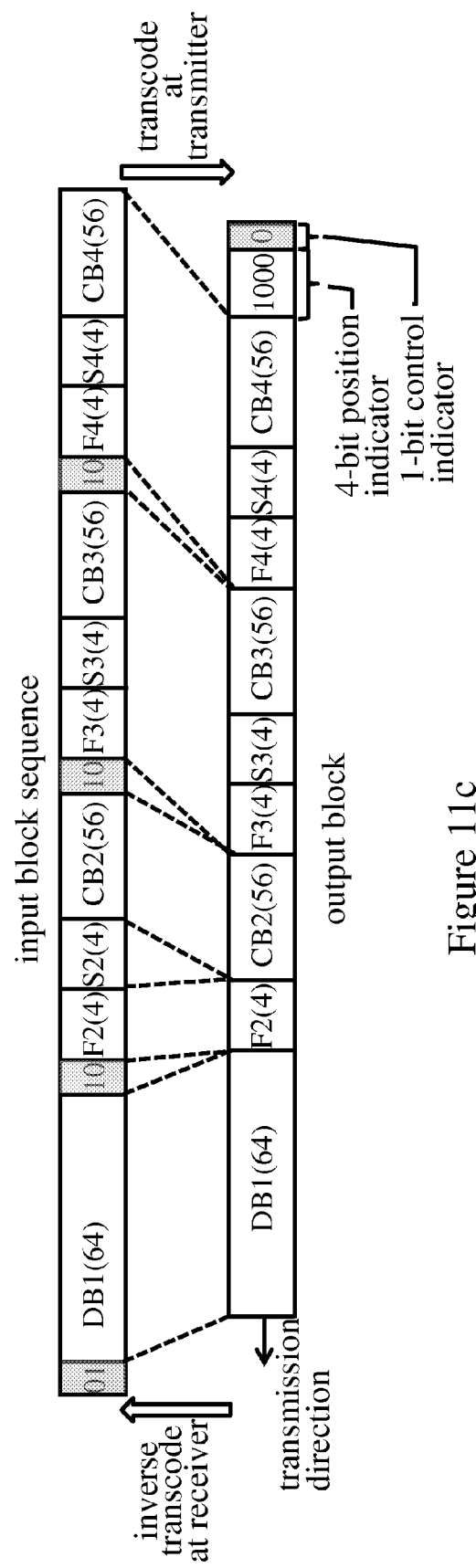

While the transcoding processes described above reduce latency associated specifically with inverse transcoding, similar principles can be applied in transcoding processes which reduce latency associated with the transcoding per se. An example will be described with reference to FIGS. 11a to 11c which illustrate formation of the transcoded output block for different input block sequences. FIG. 11a corresponds to an input block sequence comprising all data blocks: DB#1, DB#2, DB#3, and DB#4. FIG. 11b corresponds to an input block sequence comprising all control blocks: CB#1, CB#2, CB#3, and CB#4. FIG. 11c corresponds to an exemplary input block sequence with both data and control blocks: DB#1, CB#2, CB#3, and CB#4.

Operation of the transcoding method for all other input block sequences will be apparent from the following description.

In the transcoding process to be described, the input blocks in the N-block sequence are processed sequentially in the transcoder to produce the transcoded output block, preserving the block order in the input sequence. In this example, the sequence of input blocks are encoded bitwise to produce the transcoded block. As each input block is processed in the transcoder, the 2-bit input block header is deleted as before. For the input sequence of FIG. 11a, deletion of the input block headers leaves the four 64-bit data blocks concatenated in the output block as indicated. On processing the $N^{th}$ (here $4^{th}$) input block in the sequence, the transcoder adds to the sequence an (L=1)-bit control indicator. As before this control indicator indicates whether the sequence contains any control blocks. In this embodiment, the control indicator is added at the end of the sequence as a trailer to the output block. The 1-bit trailer in the transcoded block of FIG. 11a is of value "1", indicating that the output block contains no control blocks.

If the transcoder identifies a control block in the input sequence, the 2-bit header is deleted as indicated in FIGS. 11b and 11c. In addition, for the first control block in the sequence, the transcoder deletes a set of bits, here the second nibble Sj(4), from the block-type field of that control block. In FIG. 11b this is control block CB#1. In FIG. 11c this is control block CB#2. The remaining first nibble Fj(4) of the control block BTF still provides an indication of the type of the control block as already described for the embodiment of FIG. 4. On processing the $N^{th}$ (here $4^{th}$) input block in sequences with at least one control block, the transcoder adds to the sequence an N-bit (here 4-bit) position indicator indicating positions of data and control blocks in the sequence. In this embodiment, a 4-bit flag pattern is added as a position indicator as in the embodiment described with reference to FIG. 4. The 4-bit position indicator is added here at four bit-positions immediately preceding the control indicator. The position indicators for the sequences of FIGS. 11b and 11c are respectively 0000 and 1000 as indicated.

The inverse transcoder in this embodiment operates on complete output blocks, performing the inverse of the transcoding process to reconstruct the original sequence of input blocks.

It will be appreciated that, because the input blocks are sequentially processed by the transcoder to generate output block, latency associated with the transcoding process is reduced compared to prior systems which require re-ordering of data and control blocks in N-block groups. Unlike these prior systems, the transcoder need not wait for all N blocks to be received before commencing the encoding operation. If employed in the system of FIG. 3, therefore, the input buffer 9 need not store all N blocks before transcoding commences but only sufficient bits to implement the transcoding. In this embodiment where the input block sequence is processed bit-by-bit, the input buffer may simply be 1-bit buffer for receiving successive bits of the input sequence. The transcoding process thus again provides for significant reduction in overall latency, in this case by reducing latency for transcoding per se. Again, various modifications to the process can be envisaged. For example, the L bits of the control indicator and N bits of the position indicator could be included in other orders in a trailer to the sequence. In addition, the control indicator and position indicator bits could in principle be added at any predetermined bit-positions after the $(N-1)^{th}$ block in the sequence. Various modifications described in connection with the earlier embodiments can also be made to this embodiment as appropriate.

It will be appreciated that many other changes and modifications can be made to the exemplary embodiments described within the spirit and scope of the present invention.

The invention claimed is:

1. A data encoding method for encoding a sequence of N input blocks of bits into an output block for transmission, wherein each input block comprises one of a data block and a control block, the control block being one of K types of control block and including a block-type field indicating the type of that control block, the method comprising:
adding an L-bit control indicator, indicating whether the sequence contains any control blocks, as a header to the sequence; and
if the sequence contains any control blocks, producing the output block in which the order of data and control blocks in the sequence is preserved by deleting a set of bits from the block-type field of at least one control block, adding to the sequence an N-bit position indicator indicating positions of data and control blocks in the sequence, and providing in bit positions of remaining bits of the block-type field of the at least one control block an indication of the type of that control block;
wherein the position indicator bits are added at bit-positions such that, in a header-first transmission order of the output block, all data and control blocks succeed the position indicator bits indicating positions of those blocks.

2. The method of claim 1, wherein the set of bits comprises N bits.

3. The method of claim 2, wherein N=4 and the block-type field of a the control block comprises eight bits, the method including deleting the N bits by deleting one of the first and second nibbles of the block-type field.

4. The method of claim 2, wherein:
each input block includes an x-bit input block header;
the method includes deleting the input block headers from the sequence; and
L<xN.

5. The method of claim 4, wherein each data and control block is a 64-bit block and x=2.

6. The method of claim 1, further comprising deleting the set of bits from the block-type field of one control block in the sequence.

7. The method of claim 6, further comprising deleting the set of bits from the block-type field of the first control block in the sequence.

8. The method of claim 6, further comprising replacing the remaining bits of the block type field by code bits indicating the type of that control block.

9. The method of claim 6, wherein the remaining bits of the block type field indicate the type of that control block.

10. The method of claim 1, further comprising adding the N-bit position indicator at N bit-positions preceding all data and control blocks in the transmission order.

11. The method of claim 1, further comprising adding the N bits of the position indicator at distributed bit-positions each preceding a respective one of the data and control blocks in the transmission order to indicate position of that block.

12. The method of claim 1, wherein each data and control block is a 64-bit block.

13. The method of claim 12, wherein N=4 and L=1, the output block being a 257-bit block.

14. The method of claim 12, wherein N=4 and L=2, the output block being a 258-bit block.

15. A method for communicating data over a data communications network, the method comprising:
receiving a sequence of N input blocks of bits wherein each input block comprises one of a data block and a control block, the control block being one of K types of control block and including a block-type field indicating the type of that control block;
encoding the sequence into an output block by adding an L-bit control indicator, indicating whether the sequence contains any control blocks, as a header to the sequence, and, if the sequence contains any control blocks, producing an output block in which the order of data and control blocks in the sequence is preserved by deleting a set of bits from the block-type field of at least one control block, adding to the sequence an N-bit position indicator indicating positions of data and control blocks in the sequence, and providing in bit positions of remaining bits of the block-type field of the at least one control block an indication of the type of that control block, wherein the position indicator bits are added at bit-positions such that, in a header-first transmission order of the output block, all data and control blocks succeed the position indicator bits indicating positions of those blocks;
transmitting the output block over the network to a receiver; and
at the receiver, processing the output block in the header-first transmission order to decode the sequence of N input blocks.

16. A data encoding method for encoding a sequence of N input blocks of bits into an output block for transmission, wherein each input block comprises one of a data block and a control block, the control block being one of K types of control block and including a block-type field indicating the type of that control block, the method comprising sequentially processing the input blocks in the sequence to produce the output block by:
if the sequence contains any control blocks, deleting a set of bits from the block-type field of the first control block in the sequence, and providing in bit positions of remaining bits of that block-type field an indication of the type of the first control block;
on processing the Nth input block, adding to the sequence an L-bit control indicator indicating whether the sequence contains any control blocks; and
on processing the Nth input block, if the sequence contains any control blocks, adding to the sequence an N-bit position indicator indicating positions of data and control blocks in the sequence.

17. The method of claim 16, further comprising processing the sequence of blocks bitwise to produce the output block.

18. The method of claim 16, further comprising adding the control indicator in a trailer to the output block.

19. The method of claim 18, further comprising adding the N-bit position indicator in the trailer.

20. A data encoding apparatus for encoding a sequence of N input blocks of bits into an output block for transmission, wherein each input block comprises one of a data block and a control block, the control block being one of K types of control block and including a block-type field indicating the type of that control block, the apparatus comprising an input buffer for receiving the sequence of input blocks, and an encoder for producing the output block from the sequence by:

adding an L-bit control indicator, indicating whether the sequence contains any control blocks, as a header to the sequence; and if the sequence contains any control blocks, producing an output block in which the order of data and control blocks in the sequence is preserved by deleting a set of bits from the block-type field of at least one control block, adding to the sequence an N-bit position indicator indicating positions of data and control blocks in the sequence, and providing in bit positions of remaining bits of the block-type field of the at least one control block an indication of the type of that control block;

wherein the position indicator bits are added at bit-positions such that, in a header-first transmission order of the output block, all data and control blocks succeed the position indicator bits indicating positions of those blocks.

21. A data encoding apparatus for encoding a sequence of N input blocks of bits into an output block for transmission, wherein each input block comprises one of a data block and a control block, the control block being one of K types of control block and including a block-type field indicating the type of that control block, the apparatus comprising an input buffer for sequentially receiving the input blocks in the sequence, and an encoder for sequentially processing the input blocks to produce the output block by:

if the sequence contains any control blocks, deleting a set of bits from the block-type field of the first control block in the sequence, and providing in bit positions of remaining bits of that block-type field an indication of the type of the first control block;

on processing the Nth input block, adding to the sequence an L-bit control indicator indicating whether the sequence contains any control blocks; and on processing the Nth input block, if the sequence contains any control blocks, adding to the sequence an N-bit position indicator indicating positions of data and control blocks in the sequence.

22. The apparatus of claim 21, wherein the encoder is adapted to process the sequence of blocks bitwise to produce the output block.

* * * * *